United States Patent
Kupniewski et al.

(10) Patent No.: US 9,791,504 B2
(45) Date of Patent: Oct. 17, 2017

(54) CONTACTOR ARRANGEMENT, IC TEST HANDLER AND IC TEST ARRANGEMENT

(71) Applicant: Rasco GmbH, Kolbermoor (DE)

(72) Inventors: Michael Kupniewski, Kolbermoor (DE); Christian Wammetsberger, Kolbermoor (DE); Josef Mayer, Halfing (DE); Rainer Hittmann, Großkarolinenfeld (DE)

(73) Assignee: RASCO GMBH, Kolbermoor (DE)

( * ) Notice: Subject to any disclaimer, the term of this patent is extended or adjusted under 35 U.S.C. 154(b) by 167 days.

(21) Appl. No.: 14/790,022

(22) Filed: Jul. 2, 2015

(65) Prior Publication Data

US 2016/0003897 A1 Jan. 7, 2016

(30) Foreign Application Priority Data

Jul. 3, 2014 (EP) .................... 14175602

(51) Int. Cl.
  *G01R 31/00* (2006.01)
  *G01R 31/28* (2006.01)
  *G01R 1/04* (2006.01)

(52) U.S. Cl.
  CPC ....... *G01R 31/2891* (2013.01); *G01R 1/0408* (2013.01); *G01R 31/2887* (2013.01); *G01R 31/2889* (2013.01)

(58) Field of Classification Search
  CPC  G01R 31/0483; G01R 31/0466; G01R 31/28; G01R 31/2887; G01R 31/2896; G01R 31/2886; G01R 31/0433; G01R 31/2893; G01R 31/2891; G01R 31/2851; G01R 31/043; G01R 1/0416; G01R 31/0441; G01R 31/7342; G01R 31/06705; G01R 31/06794; G01R 31/07314; G01R 31/06711; G01R 31/06772;
(Continued)

(56) References Cited

U.S. PATENT DOCUMENTS 5,870,820 A * 2/1999 Arakawa ............ H05K 13/0486
29/740
6,369,596 B1 4/2002 Anderson
(Continued)

FOREIGN PATENT DOCUMENTS

DE  19805718 A1  8/1998
KR  1020110044143 B1  4/2011
(Continued)

*Primary Examiner* — Thang Le
(74) *Attorney, Agent, or Firm* — Mark M. Friedman

(57) ABSTRACT

Contactor arrangement of an IC test handler, comprising: a contactor unit which has test contacts for contacting an IC in test and for temporarily pressing the IC against the test contacts, a plunger head, which has a recessed central region corresponding to the geometrical configuration of the IC, such that those surface of the IC which is adjacent to the upper surface of the plunger head does not touch the plunger head surface, and a contactor unit interface, which includes a vacuum suction system for actively attracting the IC to an IC contact surface of the contactor unit interface, that corresponds with an adjacent surface of the IC having IC device contacts and, thus, towards the test contacts of the contactor unit.

16 Claims, 9 Drawing Sheets

(58) Field of Classification Search
CPC ........ G01R 31/06738; G01R 31/31924; G01R
31/3004; G01R 31/2884; G01R 31/31922
USPC .......................... 324/750.19, 750.22–750.25,
324/756.01–756.03, 755.22, 754.01,
324/754.03, 754.07–754.11, 754.13,
324/754.14, 757.03, 755.01, 755.11,
324/762.01–762.05, 757.01–757.05
See application file for complete search history.

(56) References Cited

U.S. PATENT DOCUMENTS

| | | | | |
|---|---|---|---|---|
| 7,471,096 B2* | 12/2008 | Kohashi | ............... | G01R 1/0466 |
| | | | | 324/750.2 |
| 2001/0038295 A1* | 11/2001 | Kim | ................... | B65G 47/918 |
| | | | | 324/750.03 |
| 2003/0020457 A1* | 1/2003 | Seng | ................. | G01R 31/2887 |
| | | | | 324/757.04 |
| 2006/0068614 A1* | 3/2006 | Harper | ................. | G01R 1/0466 |
| | | | | 439/70 |
| 2006/0119346 A1* | 6/2006 | Boyle | ................ | G01R 31/2851 |
| | | | | 324/750.13 |
| 2006/0158179 A1 | 7/2006 | Chyan | | |
| 2006/0220667 A1 | 10/2006 | Tashiro et al. | | |
| 2008/0116922 A1 | 5/2008 | Blaney et al. | | |
| 2013/0328584 A1 | 12/2013 | Lin et al. | | |

FOREIGN PATENT DOCUMENTS

| | | |
|---|---|---|
| TW | M350708 U | 2/2009 |
| TW | M456492 U | 7/2013 |
| TW | 201418733 A | 5/2014 |

* cited by examiner

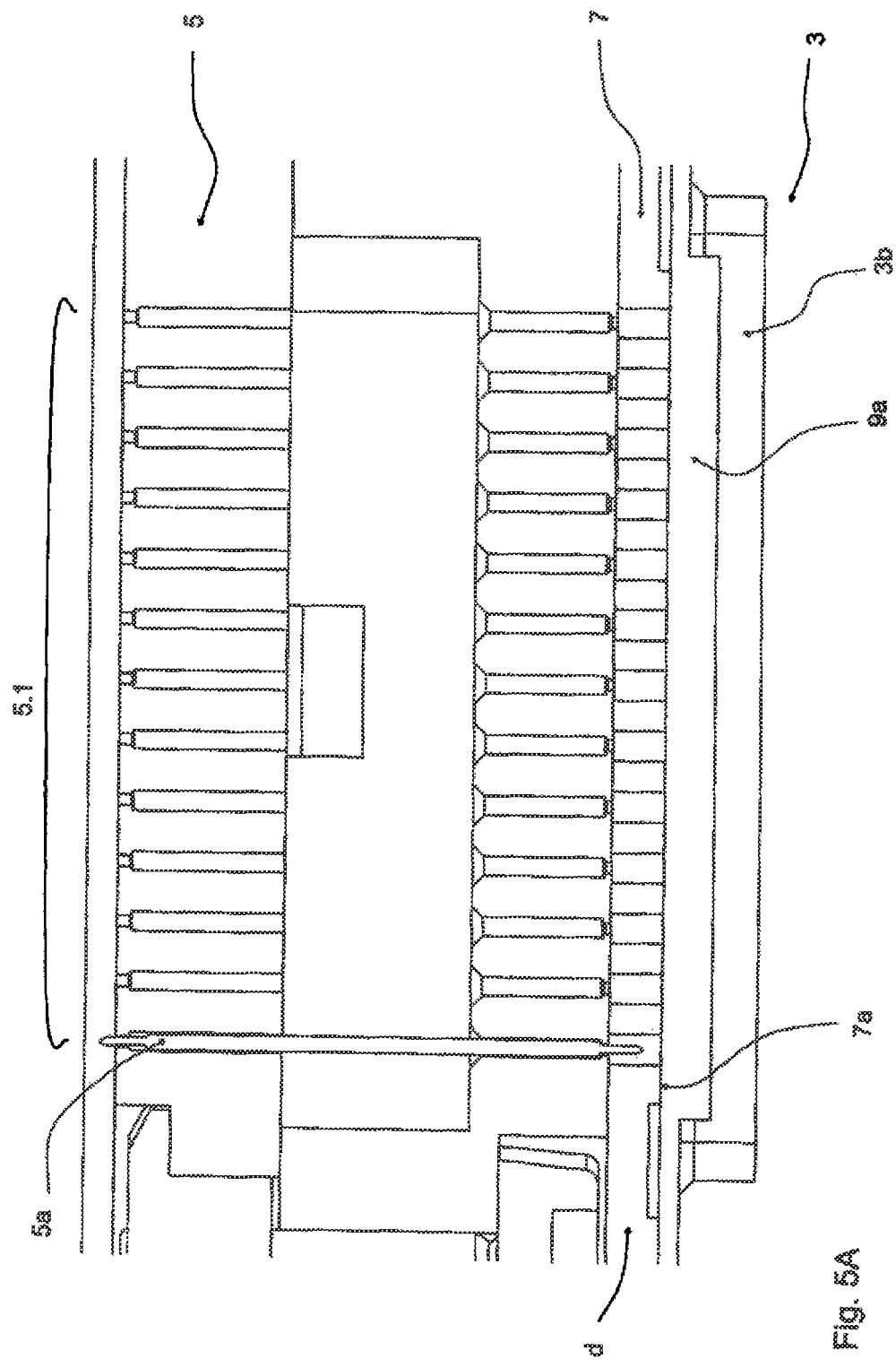

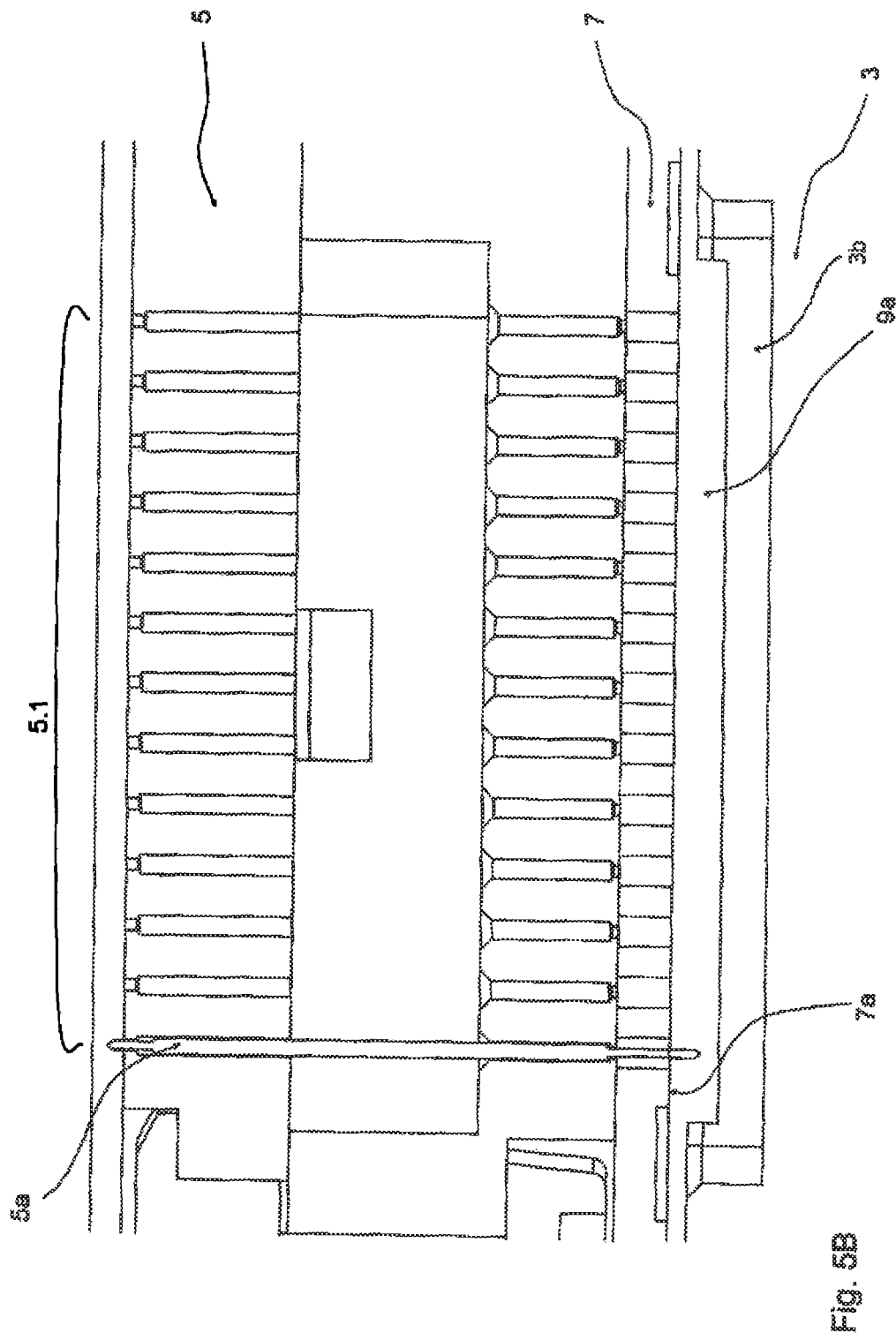

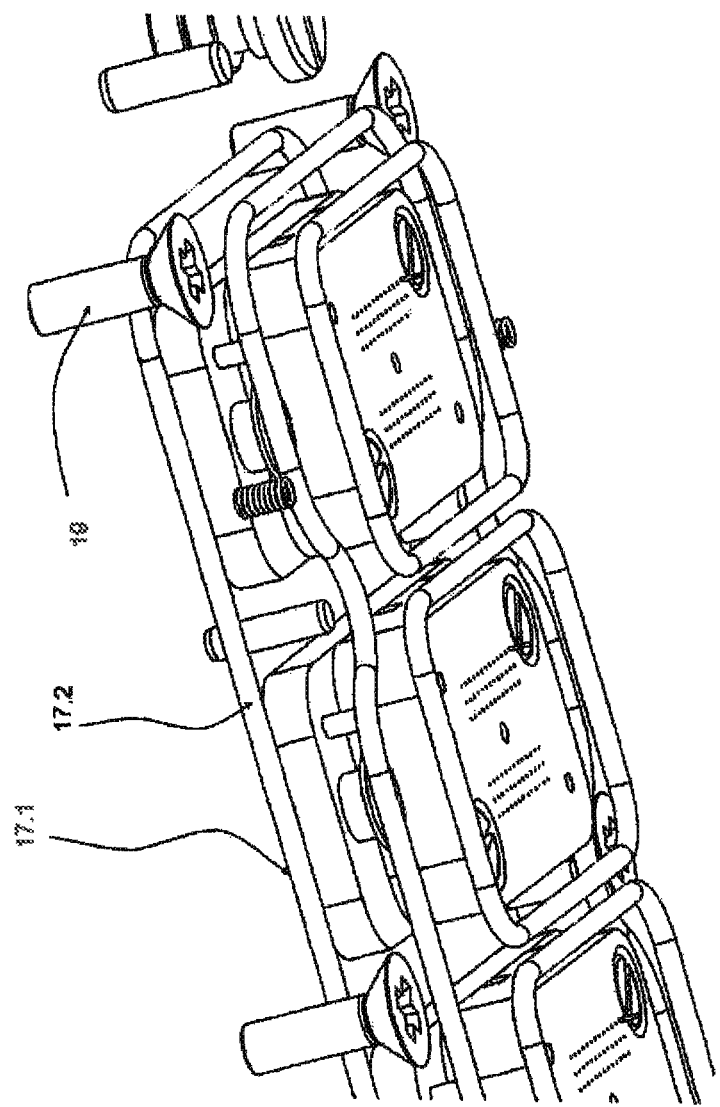

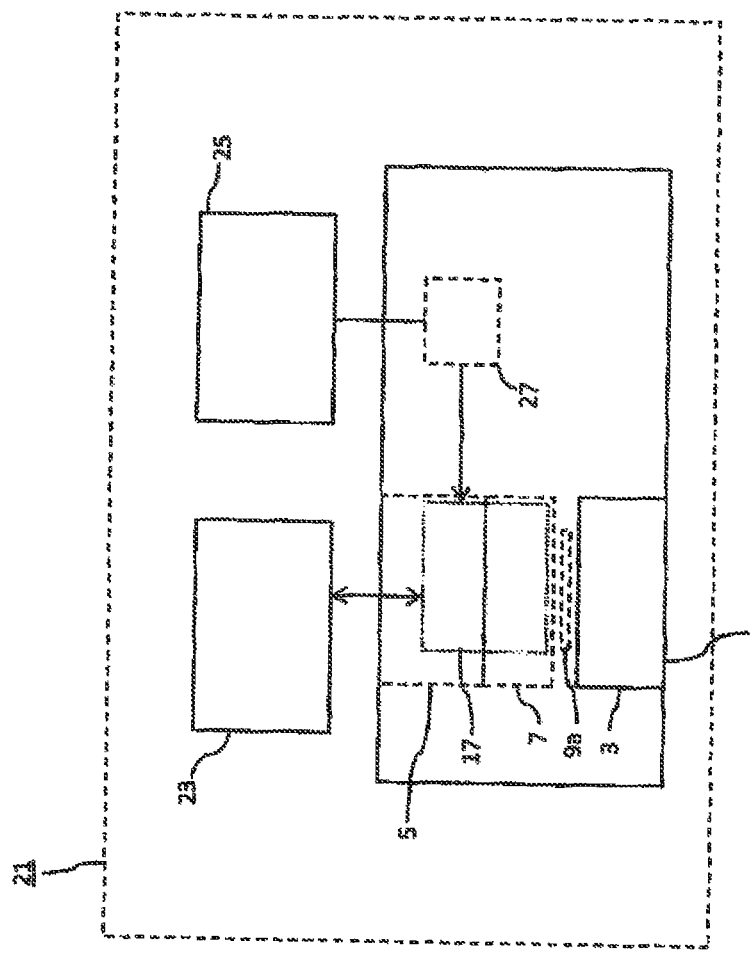

CONTACTOR ARRANGEMENT, IC TEST HANDLER AND IC TEST ARRANGEMENT

FIELD OF THE INVENTION

The invention is related to a contactor arrangement of an IC test handler, comprising: a contactor unit which has test contacts for contacting an IC or a group of ICs in test and for temporarily pressing the IC or ICs against the test contacts and a plunger head. It further relates to an IC test handler and to an IC test arrangement.

PRIOR ART

It is well-known to run test procedures on integrated circuits, e.g. in a configuration where the ICs are arranged on an IC strip, to verify the correct function of the ICs. Such test systems allow for a simultaneous testing of a plurality of ICs, which increases the throughput of the testing system and, therefore, the productivity and results in a cost reduction per IC. A dedicated test-in-strip handler places the ICs in contact with a contactor unit of the test system, maintains the contact for the duration of the test cycle, and finally sorts the ICs depending on the test results, before delivering them to a packaging stage or other stages for further processing.

In a test-in-strip handler, a loader unit is provided which contains a stack of IC strips. From this stack, individual IC strips are fed to a testing unit which comprises a plunger or plunger head, for example, that positions the selected IC strip such that the test contacts of the contactor unit come into electrical contact with respective device contacts of the ICs. Thereafter, the above-referenced test procedure is started and implemented. After testing, the IC strip is unloaded to an unloader unit, and the above-mentioned sorting operation is carried out.

The plunger head of the prior art has a basically supporting surface which contacts the body or leads of the ICs and actively presses the ICs arranged on the IC strip against an opposing contact surface of the contactor unit, where the test contacts are placed. This active pressing of the ICs against the test contacts requires a sufficient degree of mechanical stability and insensitivity of the ICs, specifically on the surface that is in test adjacent to the plunger head upper surface.

DESCRIPTION OF THE INVENTION

It is an object of the invention to provide an improved contactor arrangement which can handle ICs with low mechanical stability and/or high sensitivity against mechanical forces at that surface which is, in testing procedures, adjacent to the plunger head.

This object is, according to one aspect of the invention, solved by a contactor arrangement comprising the features of claim 1. According to a further aspect of the invention, the object is solved by an IC test handler of claim 11. According to a still further aspect of the invention, the object is solved by an IC test arrangement of claim 14. Further embodiments of the invention are subject of the dependent claims.

It is an element of the invention to provide the plunger head (in the following considered as part of the contactor arrangement with an upper surface, i.e. IC contacting surface of the head, which is recessed in a central portion, such that the adjacent surfaces of the ICs, which are loaded on the plunger head, do not have any mechanical contact with the plunger head surface. On the other hand, the plunger head is configured to support the ICs, as far as possible, outside the recessed portion, and to make sure that the loading and unloading functions of the plunger or plunger head are implemented in a reliable way.

It is a further element of the invention to provide the required contact force between the device contacts of the ICs and the test contacts of the contactor unit by additional contact force generating means which exert an attracting force to the ICs, in order to provide a tight mechanical and reliable electrical contact between the device contacts on the ICs and the test contacts of the contactor unit. More specifically, this attracting force is generated by a vacuum suction system provided in an interface which cooperates with the contactor unit on the one hand, and the plunger head with the ICs placed thereon on the other.

The proposed improved contactor arrangement provides for a reliable test handling e.g. of bare-die type ICs during test-in-strip procedures without any danger of damaging their mechanically sensitive surface. Likewise, it provides for an improved handling of other mechanically sensitive types of ICs, or in cases where a additional contacting force is needed.

In an embodiment of the invention the vacuum suction system comprises at least one vacuum channel one end of which has a connecting port to be connected to a vacuum generator and which has at least one opening in an IC contact surface of the contactor unit interface. Typically, the vacuum suction system comprises a plurality of openings in the IC contact surface, in particular, in a matrix-like arrangement.

In a further embodiment, the IC contact surface of the contactor unit interface that corresponds with the adjacent surface of the IC, is configured such that a vacuum chamber is established within the contactor unit interface and between the IC contact surface and the adjacent surface of the IC. More preferably, the vacuum suction system and in particular the vacuum chamber includes at least a portion of the contactor unit, in particular that portion of the contactor unit where the test contacts are arranged. In these embodiments, the vacuum suction system can be implemented with a low-power vacuum generator and correspondingly low power consumption.

In a practically important embodiment, the contactor unit interface is adapted to fit to a contactor unit comprising a matrix-like arrangement of spring-loaded test contacts, e.g. pogo pins, such that, in test, the test contacts penetrate the strip contact surface of the contactor unit interface and touch the device contacts of the ICs. Preferably, the contactor unit interface has a thin central portion comprising a matrix of through-holes which corresponds to the test contact matrix of the contactor unit. This central portion is surrounded by an interface frame, whereby inner edges of the interface frame correspond to outer edges of the contactor unit such that an outer circumference of the contactor unit is enclosed in the interface frame.

In a further development of the latter embodiment, first sealing means are provided for sealing the IC strip surface against the strip contact surface of the contactor unit interface, second sealing means are provided for sealing the contactor unit interface against the contactor unit, and optionally third sealing means are provided for sealing a portion of the contactor unit, which is part of the vacuum suction system, against ambient pressure portions of the contactor unit or against adjacent components of a test arrangement. In principle, in simplified arrangements where the vacuum suction system is not extended into the contactor unit, the third sealing means are not required. At least part of the first, second, and third sealing means can be implemented with conventional rubber or elastomer seals. On the other hand, part of the several sealing means can, in principle, be implemented with tightly fitting contact surfaces of the plunger head, the contactor unit interface and the contactor unit, respectively.

In a further development of the embodiments, in particular of those related to a contactor unit with spring-loaded test contacts, the contactor unit interface is movable with respect to the contactor unit along an axis which is normal to the strip contact surface, in particular against a pre-loading force of spring means or hydraulic or pneumatic pre-loading means which pre-loads the IC or an IC strip, respectively, away from the test contacts, and is driven by the plunger head towards the test contacts.

In a further embodiment, the contactor unit interface is made from or coated with a non-conductive material, e.g., made from plastic or from an aluminum alloy and coated with a plastic coating.

An IC test handler according to the invention comprises, besides a contactor arrangement as explained above, a vacuum generator connected to the vacuum suction system of the contactor unit interface, and attractive force control means for controlling the suction power applied to the IC by the vacuum suction system such that an attractive force resulting from the suction power is above a predetermined threshold value.

In an embodiment of the IC test handler, the attractive force control means are adapted for controlling the suction power applied to the IC or IC strip by the vacuum suction system such that it exceeds a total contact force which is exerted by a test contact matrix of the contactor unit against the ICs in test.

In an embodiment of the invention, the IC test handler is embodied as a test-in-strip handler, wherein the plunger head, the contactor unit, and the contactor unit interface are each adapted to receive and handle an IC strip containing a plurality of ICs, and wherein the contactor unit is adapted for simultaneously contacting the plurality of ICs on the strip. However, the invention can likewise be embodied in other types of IC test handlers, e.g. in pick-and-place handlers or gravity handlers, with correspondingly adapted plunger head, contactor unit and contactor unit interface configurations. The invention can be applied on groups of ICs, which are handled and tested simultaneously but which are not arranged on a strip but on some other carrier or tray etc. The above-mentioned recess in the plunger head or some other IC transport means, as well as the means for attracting the ICs to the test contacts will be adapted to the respective carrier or tray etc.

An improved overall test arrangement comprises, besides an IC test handler as mentioned above, a testing device which comprises a contactor unit, an IC parameter measuring and evaluating unit and a test procedure control unit, wherein the test procedure control unit is adapted to control the vacuum suction system for actively attracting an IC strip in test towards the test contacts of the contactor unit.

In an embodiment of the test arrangement, the contactor unit comprises a matrix-like arrangement of spring-loaded test contacts and the test procedure control unit is adapted to trigger the operation of the attractive force control means of the test-in-strip handler arrangement.

BRIEF DESCRIPTION OF THE DRAWINGS

Further embodiments and advantages of the invention or of specific elements or aspects thereof are explained in the following description, and related to the appending drawings. In the drawings.

FIGS. 5A and 5B are partial sectional views of the embodiment of FIG. 1 showing the pogo pin matrix in more detail; in FIG. 5A in an initial step in a lower position of the contactor unit interface, and in FIG. 5B in an in-test-state with elevated contactor unit interface;

FIG. 7 shows a partial view of the vacuum suction system of FIG. 6; and

FIG. 8 shows a functional block diagram of a test arrangement comprising a test-in-strip handler according to the present invention.

DESCRIPTION OF THE EMBODIMENTS

Figure 1:
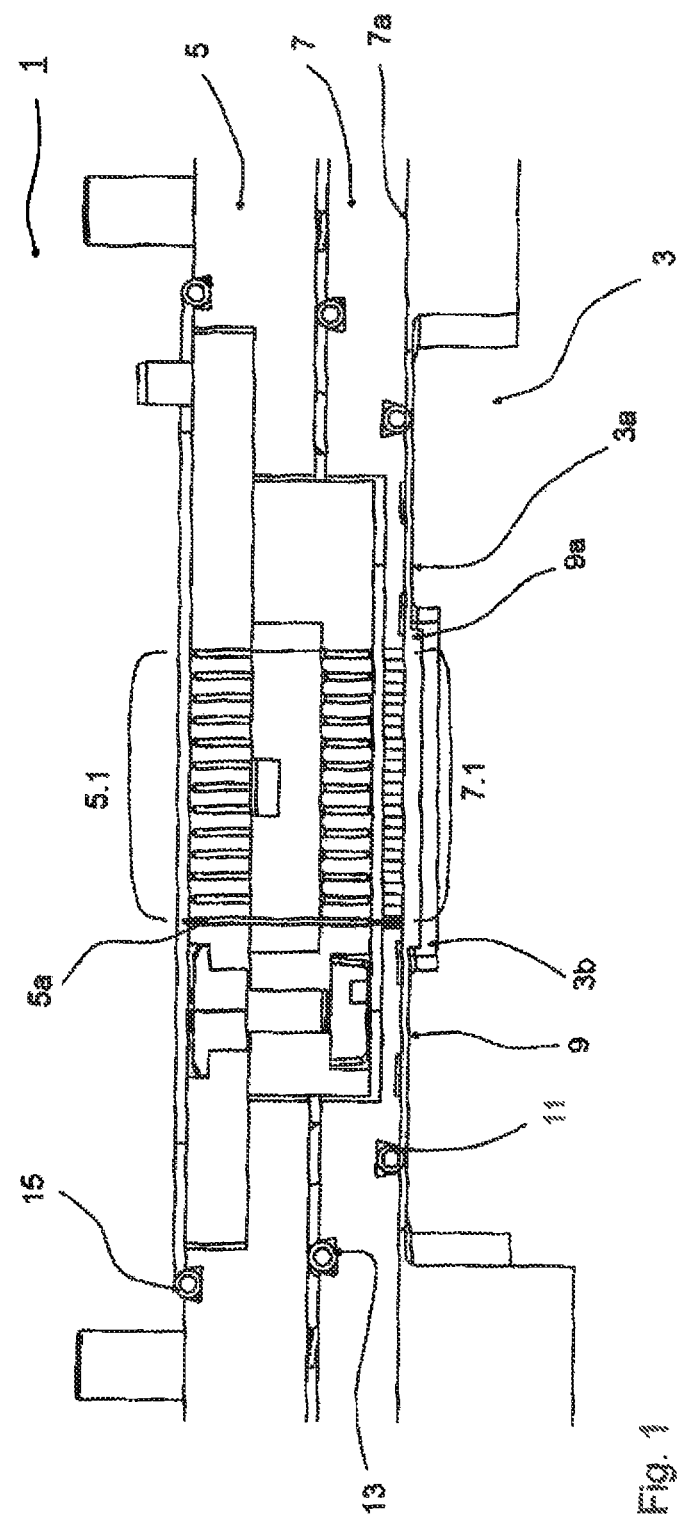
FIG. 1 shows major parts of a contactor arrangement according to an embodiment of the invention, in a sectional view.

FIG. 1 schematically shows, in a sectional view, major components of a contactor arrangement, exemplified in a test-in-strip handler 1, namely the upper portion of a plunger head 3, a contactor unit 5 and a frame-shaped contactor unit interface 7, together with an IC strip 9 inserted between the upper surface 3a of the plunger head 3 and the lower surface (strip contacting surface) 7a of the contactor unit interface 7.

In the upper central portion of the plunger head 3, a recess 3b is provided, the position and dimensions of which correspond to the position and dimensions of an IC group which is arranged on the IC strip 9. The recess 3b serves for making sure that the lower surfaces of ICs 9a arranged on the IC strip 9 do not come into mechanical contact with the plunger head surface. This is particularly important in case that the ICs are of the bare-die type, i.e., a type for which any mechanical contact to the surface opposed to their contact surface should be avoided. The contactor unit 5 comprises a matrix-shaped arrangement 5.1 of a plurality of spring-loaded pogo pins 5a serving as test contacts.

The contactor unit interface 7 comprises a corresponding arrangement 7.1 of through holes to be penetrated by the pogo pins 5a of the contactor unit 5 in operation of the handler arrangement (in the following, simply mentioned as "in-test").

First, second, and third sealing elements (rope seals) 11, 13, 15 are provided between the upper surface 3a of the plunger head 3 and the strip contacting surface 7a of the contactor unit interface, between the upper surface of the contactor unit interface 7 and the lower surface of the contactor unit 5 and on the upper surface of the contactor unit 5, respectively. The latter seal 15 serves for sealing the upper surface of the contactor unit 5 against an adjacent surface of an interface, e.g. a PCB board (not shown) of a test device. The functions of the seals 11, 13, 15 are explained further below.

Figure 2:
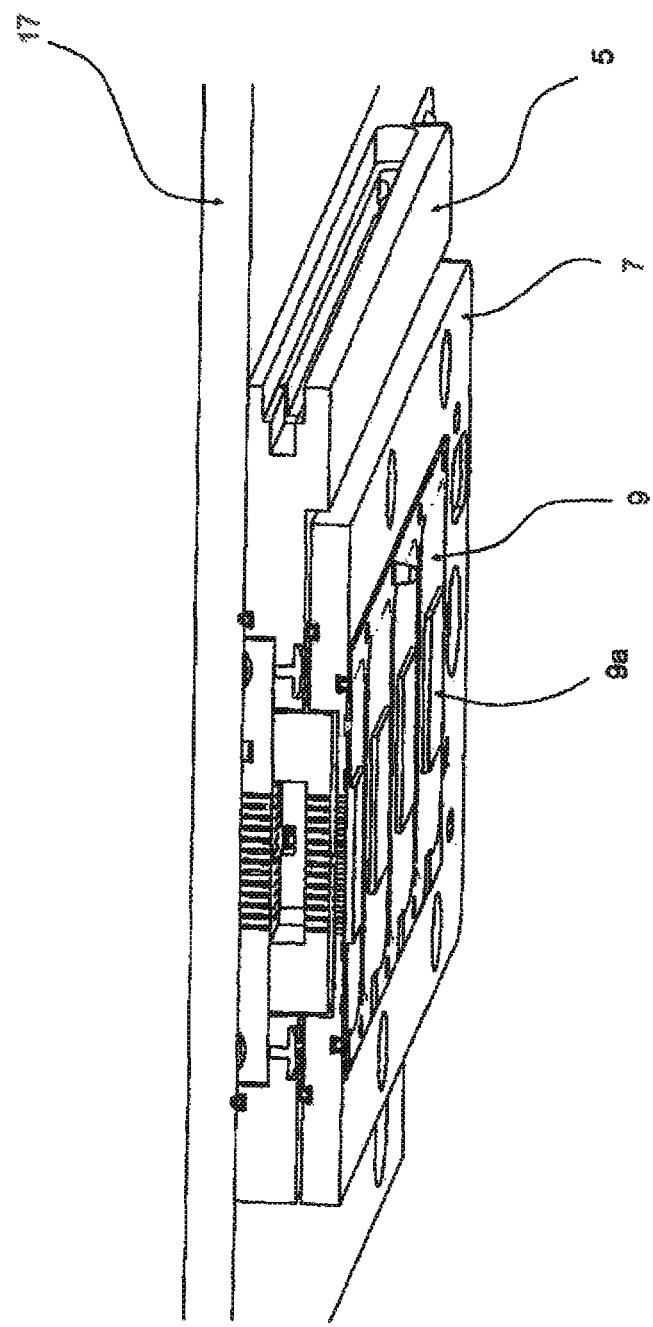
FIG. 2 shows a contactor unit and contactor unit interface, according to the embodiment of FIG. 1, together with a portion of a test device, in a perspective sectional view.
Figure 3:
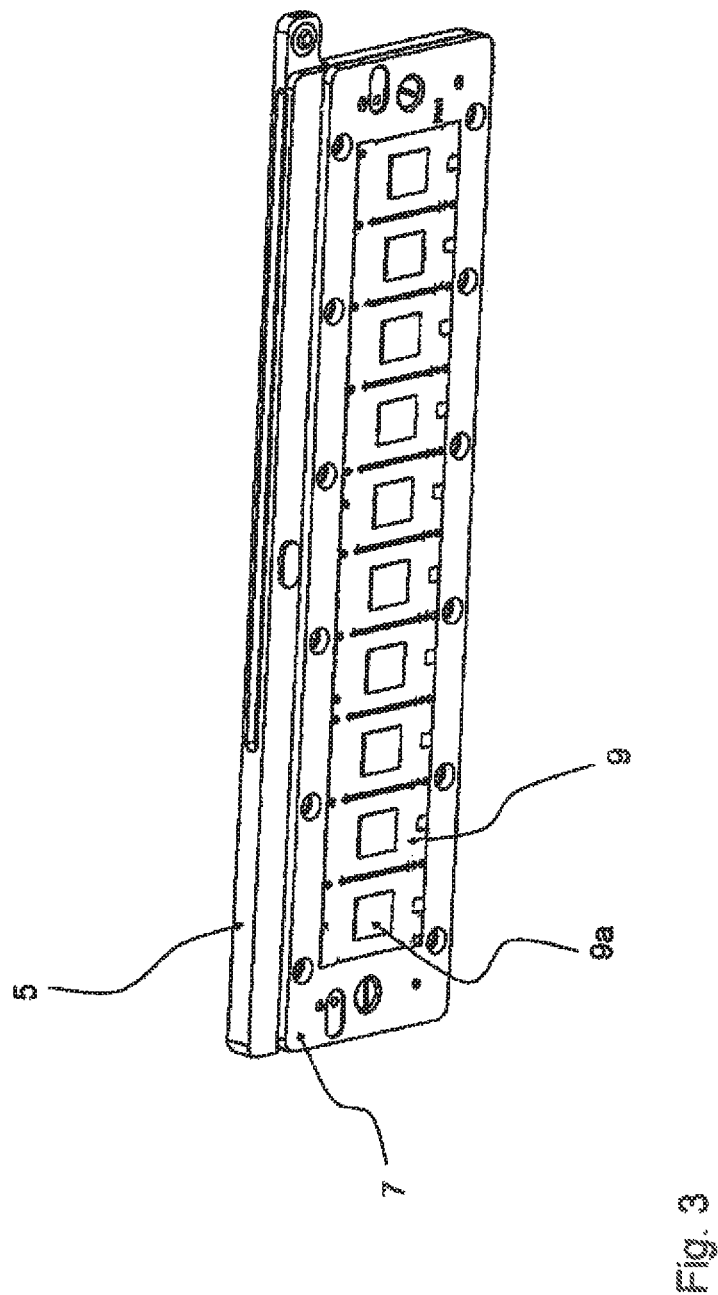
FIG. 3 shows an embodiment of the contactor unit and contactor unit interface in a perspective view taken from the IC strip side.

FIG. 2 shows, in a perspective sectional view, the contactor unit 5 together with the contactor unit interface 7 and the IC strip 9. Above the contactor unit 5, a PCB board 17 of a test device is shown schematically. In this figure, several ICs 9*a* arranged on the IC strip 9 can be recognised. Whereas FIG. 2 shows only a part of the contactor unit 5, contactor unit interface 7 and IC strip 9, all these are shown in their full extension in FIG. 3.

Figure 4:
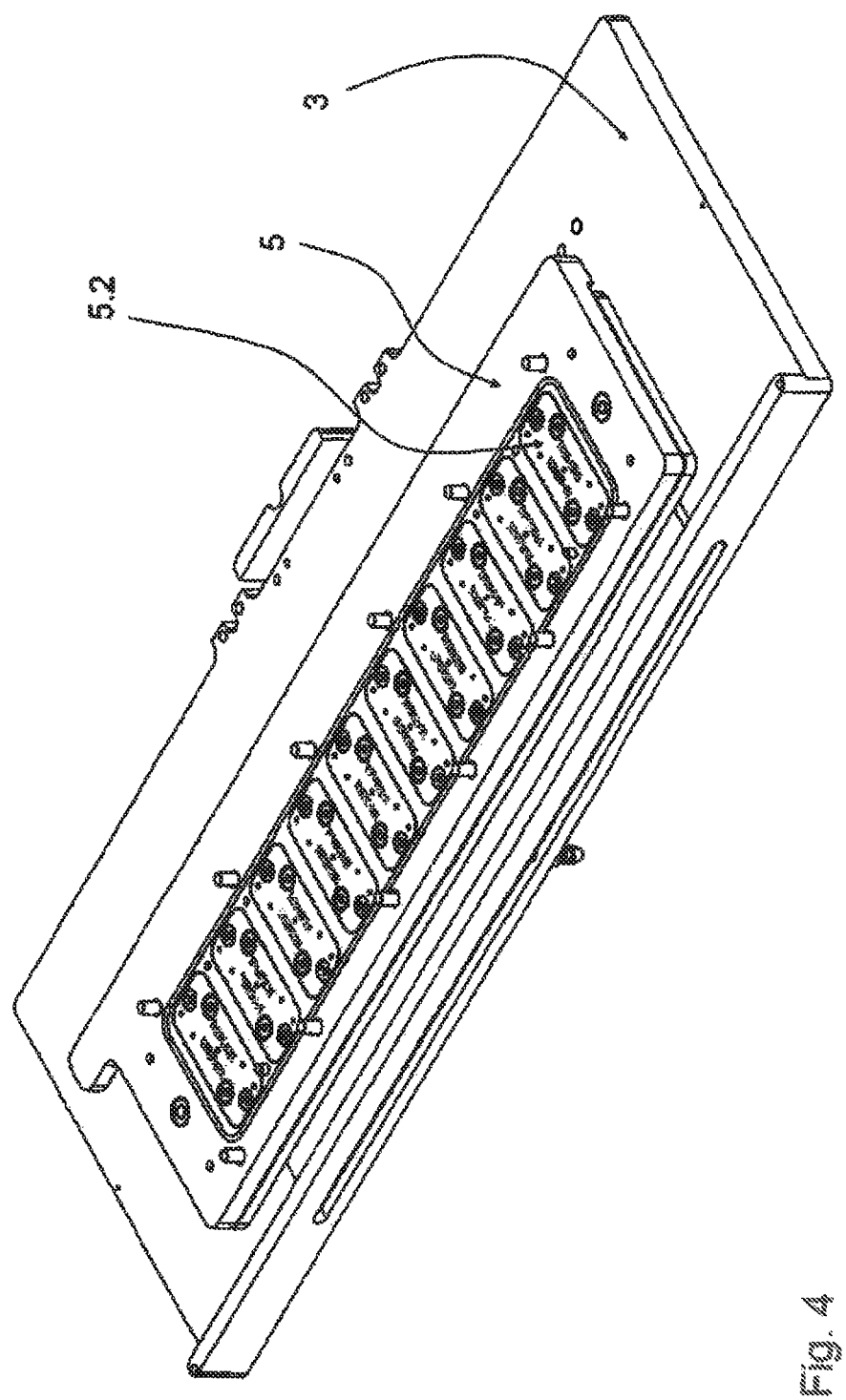
FIG. 4 shows an embodiment of the contactor unit and contactor unit interface, together with the plunger head, in a perspective view taken from the test device side.

FIG. 4 shows the contactor unit 5, together with the plunger head 3, in a perspective view taken from above, i.e., from a point of view where, in operation of a test-in-strip test arrangement, the test device would be provided. In this view, it can be recognised that, in the contactor unit 5, a plurality of IC contacting and supporting portions 5.2 is provided, which in this exemplary embodiment corresponds to the number of ICs arranged on an IC strip to be tested.

FIGS. 5A and 5B show, in magnified sectional views, the pogo pin arrangement 5.1 of the contactor unit 5, together with the corresponding portion of the contactor unit interface 7, an IC 9*a* and the recessed surface portion 3*b* of the plunger head 3. FIG. 5A shows an initial state, wherein the upper surface (comprising the device contacts) of the IC 9*a* tightly contacts the lower surface (IC contact surface) 7*a* of the contactor unit interface 7, whereas the upper surface of the contactor unit interface 7 is still at a small distance d to the lower surface of the contactor unit 5. FIG. 5B shows an in-test-state of the handler arrangement, wherein by activating a vacuum suction system (see further below), the IC 9*a* is attracted to the lower tips of the pogo pins 5*a*, to provide the required electrical contact to the respective device contacts (not shown) of the IC. In this state, the initial distance between the upper surface of the contactor unit interface 7 has disappeared.

The function of the handler arrangement according to FIGS. 1-5 and the above-referenced structure is as follows:

An IC strip 9 with a plurality of bare-die ICs 9*a* thereon is arranged on the plunger head 3 such that the peripheral portions of the IC strip 9 lie on the flat or plane outer portion of the plunger head surface 3*a* and are supported by the plunger head 3 and can be moved and fed to a test position by correspondingly controlled motions of the plunger head 3, as usual. However, due to the provision of the recess 3*b* in the central portion of the plunger head 3, the lower surfaces of the ICs 9*a* do not contact the plunger head.

After having arrived at an appropriate xy position to be contacted by the contactor unit 5, the respective IC strip 9 is attracted towards the strip contact surface or lower surface of the contactor unit interface 7, by actuating a vacuum suction system within the contactor unit 5 and contactor unit interface 7, as described in more detail further below. Due to the attractive force generated by the vacuum suction system, the IC strip 9 and, in particular, the ICs 9*a* are elevated by a z axis increment d, and their device contacts are brought into elastic pressure contact with the tips of the spring-loaded pogo pins 5*a* of the test contact arrangement 5.1 of the contactor unit 5. In this state, the upper surfaces of the ICs 9*a* are fully flush with the strip contact surface 7*a*, although the IC strip 9 is not supported by the plunger head 3 in these regions.

The z axis increment d is determined such that the contact pressure of the pogo pins against the corresponding device contacts of the ICs 9*a* is sufficient for all test requirements. The attractive force generated by the vacuum suction system is pre-determined such that even the force which is excerted on the ICs by the pogo pins 5*a* does not result in any warpage or deflection, for instance, of the central portion of the IC strip 9 away from the strip contact surface 7*a* of the contactor unit interface 7. Hence, even in test the ICs 9*a* are arranged ideally flush with the strip contact surface.

After the test program is terminated, the vacuum suction system is deactivated, and the IC strip 9 falls down to the plunger head, such that the IC strip 9 is now, again, exclusively held by the plunger head and without mechanical contact with the tips of the pogo pins 5*a* and the contactor unit interface. In this state, the IC strip and the ICs can be fed to other processing sites, e.g., to be sorted or handled according to a pre-determined handling scheme.

Figure 6:
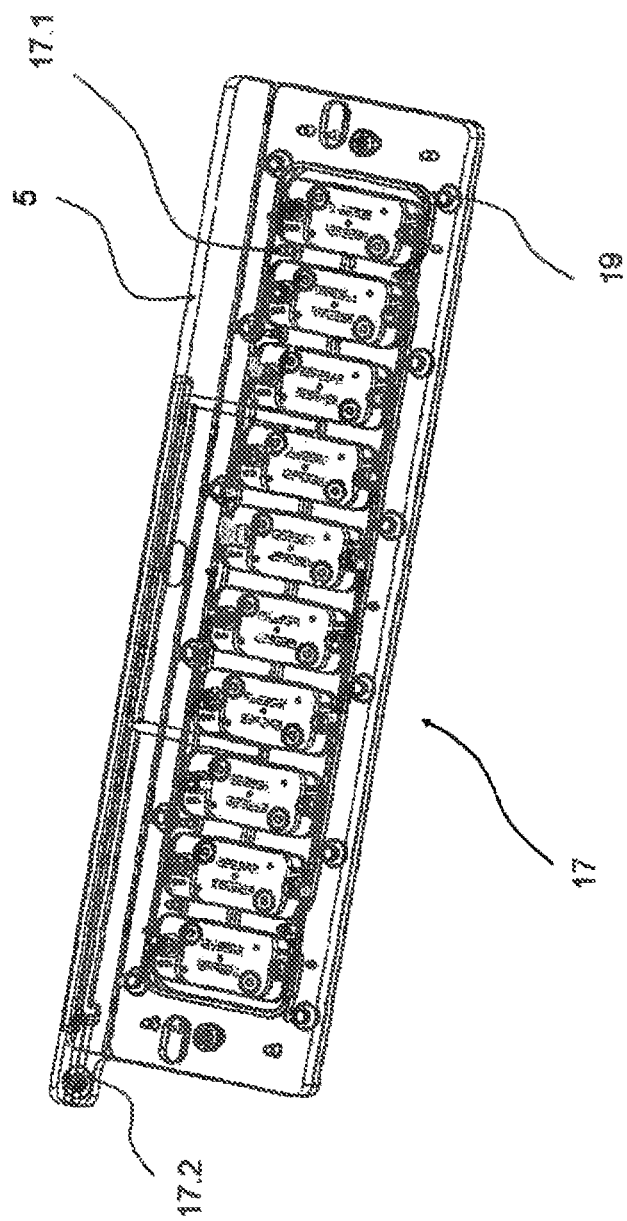
FIG. 6 shows a vacuum suction system structure of the contactor unit/contactor unit interface, in a perspective view with removed cover plate.

FIG. 6 shows, in a perspective view corresponding to that of FIG. 4, the inner structure of the contactor unit 5 and, more specifically, a vacuum suction system 17 provided therein, comprising vacuum channels 17.1 and a connecting port 17.2 for connecting the vacuum suction system to a vacuum pump (not shown). FIG. 7 shows, in a partial view, the spatial arrangement of the vacuum channels 17.1 in more detail, and this figure also shows terminals (ports) 17.2 of the vacuum suction system, which are open to the strip contact surface 7*a* of the contactor unit interface (not shown in this figure), which is mounted to the contactor unit by a plurality of screws 19.

By connecting the connection port 17.2 of the vacuum suction system 17 to an external vacuum pump (not shown) through the vacuum channels 17.1 and the ports 17.3, a vacuum is applied to basically the space encircled by the above-referenced sealings 11, 13, and 15, thus forming a vacuum chamber, the lower limiting surface of which is basically constituted by the upper surface of the IC strip 9. Thus, the above-referenced attractive force to the ICs to be tested is provided.

FIG. 8 schematically shows, as a functional block diagram, a test-in-strip test arrangement 21 comprising a contactor arrangement 1 according to FIG. 1, an IC parameter measuring and evaluating unit 23, and a test procedure control unit 25. The handler 1 comprises, as explained in more detail further above, the plunger head 3, the contactor unit 5, and the contactor unit interface 7 and, more specifically, a vacuum suction system 17 within the contactor unit 5 and the contactor unit interface 7.

Between the contactor unit 5 and the IC parameter measuring and evaluating unit 23 in test, there is a bidirectional signal and control connection for executing a predetermined test program and retrieving the corresponding signals from the ICs 9*a*. The test procedure control unit 25 has an output connection to the vacuum suction system 17, via an attractive force control means 27, for controlling the above-referenced operation of the vacuum suction system.

The embodiments and aspects of the invention explained above are not determined to limit the scope of the invention, which is exclusively to be determined by the attached claims. Many modifications of the inventive concept are possible within the scope of the claims and, more specifically, arbitrary combinations of the several claim features are considered to be within the scope of the invention.

The invention claimed is:

1. A contactor arrangement, comprising:
    a contactor unit that has test contacts for contacting an IC or a group of ICs in test and for temporarily pressing the IC against the test contacts,
    a plunger head, which has a recessed central region in an upper surface of the plunger head, the recessed central region corresponding to a geometrical configuration of the IC, such that a lower surface of the IC which is opposite the recessed central region does not touch the upper surface of the plunger head, and
    a contactor unit interface, which includes a vacuum suction system for actively attracting the IC to an IC contact surface of the contactor unit interface that corresponds with an adjacent an upper surface of the IC having IC device contacts and towards the test contacts of the contactor unit.

2. The contactor arrangement of claim 1, wherein the vacuum suction system comprises:
   a. at least one vacuum channel, one end of the vacuum channel has a connecting port to be connected to a vacuum generator, and
   b. at least one opening in the IC contact surface of the contactor unit interface.

3. The contactor arrangement of claim 2, wherein the vacuum suction system includes a feature selected from the group consisting of:
   a. a plurality of openings in the IC contact surface, and
   b. a plurality of openings in the IC contact surface in a matrix-like arrangement.

4. The contactor arrangement of claim 1, wherein the IC contact surface of the contactor unit interface that corresponds with the upper surface of the IC having IC device contacts, is configured such that a vacuum chamber is established within the contactor unit interface and between the IC contact surface and the upper surface of the IC.

5. The contactor arrangement of claim 1, wherein the vacuum suction system includes a vacuum chamber, the vacuum chamber including a portion selected from the group consisting of:
   a. at least a portion of the contactor unit, and
   b. the portion of the contactor unit where the test contacts are arranged.

6. The contactor arrangement of claim 1, wherein the contactor unit interface is adapted to fit to a contactor unit comprising a matrix-like arrangement of spring-loaded test contacts, such that, in test, the test contacts penetrate the IC contact surface of the contactor unit interface and touch the device contacts of the IC.

7. The contactor arrangement of claim 6, wherein the contactor unit interface has:
   a. a thin central portion comprising a matrix of through-holes which corresponds to a test contact matrix of the contactor unit, and
   b. an interface frame surrounding the thin central portion, whereby inner edges of the interface frame correspond to outer edges of the contactor unit such that an outer circumference of the contactor unit is enclosed in the contactor unit interface frame.

8. The contactor arrangement of claim 5, including at least one seal selected from the group consisting of:
   a. a first seal for sealing the IC surface against the IC contact surface of the contactor unit interface,
   b. a second seal for sealing the contactor unit interface against the contactor unit, and
   c. a third seal for sealing the portion of the contactor unit, which is part of the vacuum suction system, against ambient pressure portions of the contactor unit or against adjacent components of a test arrangement.

9. The contactor arrangement of claim 1, wherein the contactor unit interface is movable with respect to the contactor unit along an axis which is normal to a strip contact surface, against a pre-loading force of spring pre-loading or hydraulic or pneumatic pre-loading which pre-loads the IC away from the test contacts, and is driven by the vacuum suction system towards the test contacts.

10. The contactor arrangement of claim 1, wherein the contactor unit interface is made from or coated with a non-conductive material, e.g., made from plastic or from an aluminum alloy and coated with a plastic coating.

11. An IC test handler comprising
   a. the contactor arrangement of claim 1,
   b. a vacuum generator connected to the vacuum system of the contactor unit interface, and
   c. attractive force control for controlling the suction power applied to the IC by the vacuum system such that an attractive force resulting from the suction power is, in operation, above a predetermined threshold value.

12. The IC test handler of claim 11, wherein the attractive force control are adapted for controlling the suction power applied to the IC by the vacuum system such that the suction power is selected from the group consisting of:
   a. exceeding a total contact force which is exerted by a test contact matrix of the contactor unit against the IC in test; and
   b. exceeding a total contact force which is exerted by both a test contact matrix of the contactor unit against the IC in test and a pre-loading force.

13. The IC test handler of claim 11, adapted as a test-in-strip handler, wherein the plunger head, the contactor unit, and the contactor unit interface are each adapted to receive and handle an IC strip containing a plurality of ICs, and wherein the contactor unit is adapted for simultaneously contacting the plurality of ICs on the strip.

14. An IC test arrangement, comprising:
   a. an IC test handler of claim 11, and
   b. a testing device that comprises:
      i. a contactor unit,
      ii. an IC parameter measuring and evaluating unit, and
      iii. a test procedure control unit,
   wherein the test procedure control unit is adapted to control the vacuum suction system for actively attracting an IC in test towards the test contacts of the contactor unit.

15. The IC test arrangement of claim 14, wherein
   a. the contactor unit comprises a matrix-like arrangement of spring-loaded test contacts and
   b. the test procedure control unit is adapted to trigger the operation of the attractive force control of the IC test handler of claim 12.

16. An IC test handler comprising the contactor arrangement of claim 1.

* * * * *